US012580530B2

(12) United States Patent
Han et al.

(10) Patent No.: US 12,580,530 B2
(45) Date of Patent: Mar. 17, 2026

(54) COMMUNICATION CIRCUIT INCLUDING AMPLIFIER MODULE, AND ELECTRONIC DEVICE COMPRISING SAME

(71) Applicant: Samsung Electronics Co., Ltd., Suwon-si (KR)

(72) Inventors: Janghoon Han, Suwon-si (KR); Daehee Park, Suwon-si (KR); Jungmin Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 38 days.

(21) Appl. No.: 18/418,931

(22) Filed: Jan. 22, 2024

(65) Prior Publication Data

US 2024/0171135 A1      May 23, 2024

Related U.S. Application Data

(63) Continuation of application No. PCT/KR2022/015971, filed on Oct. 19, 2022.

(30) Foreign Application Priority Data

Oct. 20, 2021      (KR) ........................ 10-2021-0140478

(51) Int. Cl.
*H03F 3/19*          (2006.01)
*H04B 7/06*          (2006.01)

(52) U.S. Cl.
CPC ............. *H03F 3/19* (2013.01); *H04B 7/0617* (2013.01); *H03F 2200/451* (2013.01)

(58) Field of Classification Search
CPC .... H03F 3/19; H03F 2200/451; H04B 7/0617
USPC .......................................................... 375/295
See application file for complete search history.

(56) References Cited

U.S. PATENT DOCUMENTS

| | | | |
|---|---|---|---|
| 6,728,554 B1 | 4/2004 | Wegner | |
| 7,123,087 B2 | 10/2006 | Ohnishi et al. | |
| 8,515,363 B2 | 8/2013 | Imamura et al. | |
| 10,097,215 B2 | 10/2018 | Song et al. | |

(Continued)

FOREIGN PATENT DOCUMENTS

| | | | |
|---|---|---|---|
| KR | 20060014822 | * | 8/2004 |
| KR | 10-0651159 B1 | | 11/2006 |

(Continued)

OTHER PUBLICATIONS

International Search Report dated Jan. 31, 2023, issued in International Patent Application No. PCT/KR2022/015971.

(Continued)

*Primary Examiner* — Leila Malek
(74) *Attorney, Agent, or Firm* — Jefferson IP Law, LLP

(57)          ABSTRACT
An electronic device is provided. The electronic device includes an amplifier array including at least one amplifier circuitry, an antenna array including at least one millimeter-wave (mmWave) antenna connected to the at least one amplifier circuitry, and a communication processor to identify a state of the electronic device, identify an operation mode of the amplifier array, corresponding to the state of the electronic device, control the amplifier array to operate in the operation mode, and control the antenna array to radiate a beam based on a signal amplified by the amplifier array operating in the operation mode.

12 Claims, 9 Drawing Sheets

(56)                    References Cited

U.S. PATENT DOCUMENTS

| | | | |
|---|---|---|---|
| 10,278,143 B2 | 4/2019 | Kam | |
| 2003/0222709 A1 | 12/2003 | Kim | |
| 2013/0130750 A1* | 5/2013 | Chang ........................ | H03F 3/19 |
| | | | 455/571 |
| 2013/0265111 A1* | 10/2013 | Ota ......................... | H03F 3/193 |
| | | | 330/286 |
| 2014/0292579 A1 | 10/2014 | Oh et al. | |
| 2015/0070225 A1 | 3/2015 | Lee et al. | |
| 2018/0102740 A1 | 4/2018 | Chang et al. | |
| 2019/0191483 A1 | 6/2019 | Ryoo et al. | |
| 2020/0021024 A1 | 1/2020 | Park et al. | |

FOREIGN PATENT DOCUMENTS

| | | | |
|---|---|---|---|
| KR | 10-0654644 B1 | 12/2006 | |
| KR | 10-0750967 B1 | 8/2007 | |
| KR | 10-2007-0108790 A | 11/2007 | |
| KR | 10-2009-0030896 A | 3/2009 | |
| KR | 10-2013-0104370 A | 9/2013 | |
| KR | 10-2017-0003837 A | 1/2017 | |
| KR | 10-2018-0018455 A | 2/2018 | |
| KR | 10-2019-0028915 A | 3/2019 | |
| KR | 10-1975830 B1 | 5/2019 | |

OTHER PUBLICATIONS

Korean Office Action dated Jan. 8, 2026, issued in Korean Patent
Application No. 10-2021-0140478.

* cited by examiner

Figure 8:
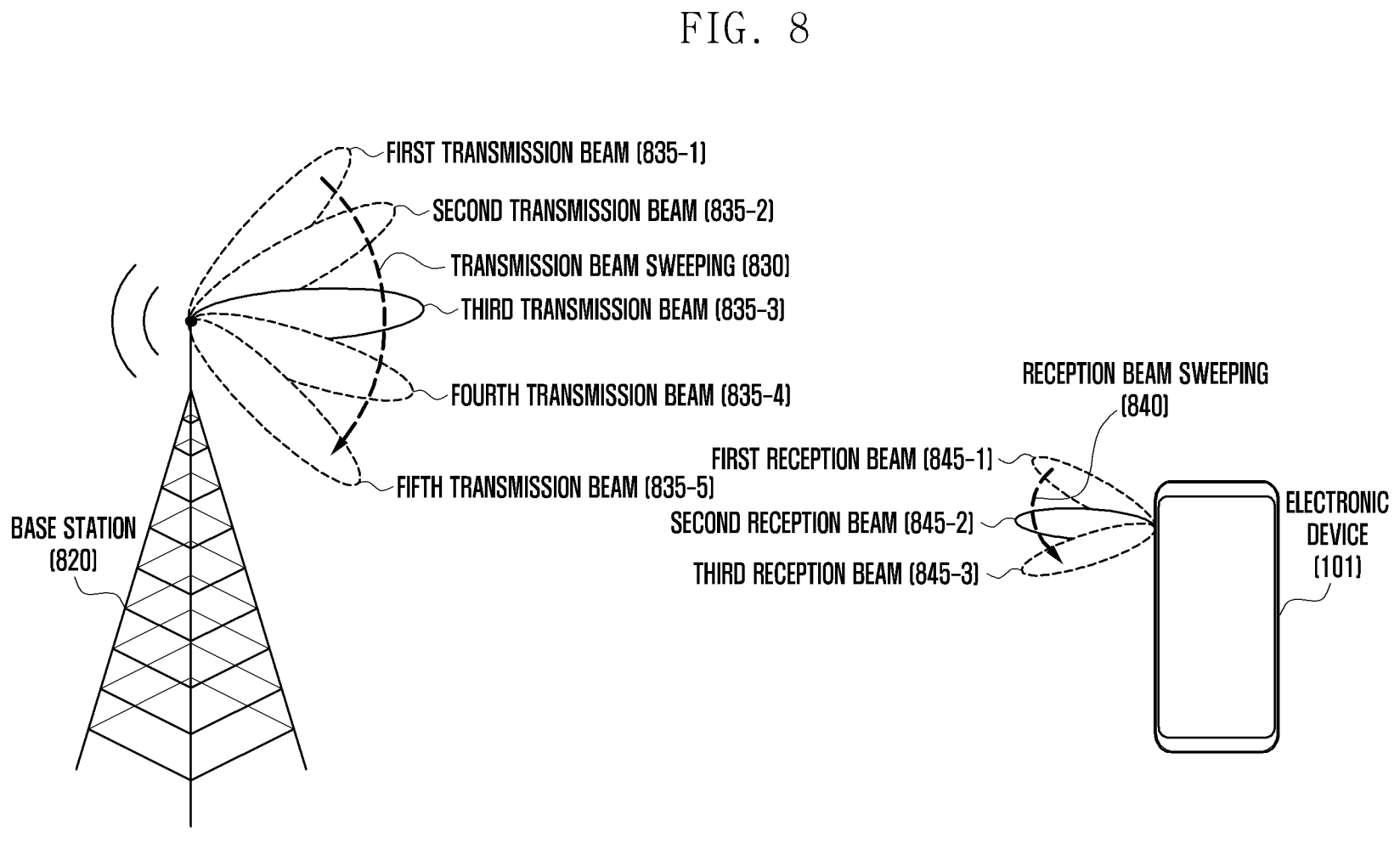

FIRST TRANSMISSION BEAM (835-1)

SECOND TRANSMISSION BEAM (835-2)

TRANSMISSION BEAM SWEEPING (830)

THIRD TRANSMISSION BEAM (835-3)

FOURTH TRANSMISSION BEAM (835-4)

FIFTH TRANSMISSION BEAM (835-5)

BASE STATION (820)

RECEPTION BEAM SWEEPING (840)

FIRST RECEPTION BEAM (845-1)

SECOND RECEPTION BEAM (845-2)

THIRD RECEPTION BEAM (845-3)

ELECTRONIC DEVICE (101)

COMMUNICATION CIRCUIT INCLUDING AMPLIFIER MODULE, AND ELECTRONIC DEVICE COMPRISING SAME

CROSS-REFERENCE TO RELATED APPLICATION(S)

This application is a continuation application, claiming priority under § 365(c), of an International application No. PCT/KR2022/015971, filed on Oct. 19, 2022, which is based on and claims the benefit of a Korean patent application number 10-2021-0140478, filed on Oct. 20, 2021, in the Korean Intellectual Property Office, the disclosure of which is incorporated by reference herein in its entirety.

BACKGROUND

1. Field

The disclosure relates to an electronic device and a communication circuit including an amplifier module.

2. Description of Related Art

An electronic device may output stored information as a sound or an image. As an electronic device has become more integrated, and ultra-high-speed and large-capacity wireless communication has become common, recently, one electronic device such as a mobile communication terminal may be equipped with various functions. For example, not only communication functions, but also entertainment functions such as games, multimedia functions such as music/video reproduction, communication and security functions for mobile banking, and functions such as schedule management and electronic wallets are being integrated into one electronic device.

In a communication device mounted in an electronic device, efforts are being made to develop a next-generation communication system, for example, a next-generation (e.g., fifth-generation (5G)) communication system or a pre-next-generation communication systems, in order to satisfy growing demand for wireless data traffic since the commercialization of fourth-generation (4G) communication systems.

In order to achieve a high data rate, a next-generation communication system is being implemented in an ultra-high frequency band (a band of several tens of gigahertz (GHz), for example, a band of 6 GHz or more and 300 GHz or less) such as millimeter-wave (mmWave). In order to mitigate the path loss of radio waves and increase the propagation distance of radio waves in the ultra-high frequency band, beamforming, massive multiple-input multiple-output (massive MIMO), full dimensional MIMO (FD-MIMO), antenna array, analog beam-forming, and large scale antenna technologies are being developed.

The above information is presented as background information only to assist with an understanding of the disclosure. No determination has been made, and no assertion is made, as to whether any of the above might be applicable as prior art with regard to the disclosure.

SUMMARY

An electronic device regulates a level of an input power applied to a communication module in order to control an uplink target power in response to an electric-field situation of a network.

Aspects of the disclosure are to address at least the above-mentioned problems and/or disadvantages and to provide at least the advantages described below. Accordingly, an aspect of the disclosure is to provide an electronic device including a low-power mode operation scheme capable of reducing power consumption in a communication circuit. Specifically, in order to reduce power consumption of a communication module in the 5G communication system, the electronic device operates an operation mode of a group of amplifiers that differentially controls the output modes of the amplifier modules respectively connected to the array antennas of the communication module. For example, the electronic device may operate an operation mode of an amplifier group in response to a state of the electronic device such as a low-power mode of a mobile terminal, a low remaining battery level, or an electric field state.

Another aspect of the disclosure is to provide an electronic device including an amplifier module having transistors of different sizes, and selecting and applying a bias at which each transistor can operate, so as to control the output mode of the amplifier module.

Additional aspects will be set forth in part in the description which follows and, in part, will be apparent from the description, or may be learned by practice of the presented embodiments.

In accordance with an aspect of the disclosure, an electronic device is provided. The electronic device includes an amplifier array including at least one amplifier circuitry, an antenna array including at least one mmWave antenna connected to the at least one amplifier circuitry, and a communication processor configured to identify a state of the electronic device, identify an operation mode of the amplifier array corresponding to the state of the electronic device, control the amplifier array to operate in the operation mode, and control the antenna array to radiate a beam based on a signal amplified by the amplifier array operating in the operation mode.

In accordance with another aspect of the disclosure, an operation method of an electronic device is provided. The operation method includes identifying a state of the electronic device, identifying an operation mode of an amplifier array including at least one amplifier circuitry corresponding to the state of the electronic device, controlling the amplifier array to operate the amplifier array in the operation mode, and controlling the antenna array to radiate a beam based on a signal amplified by the amplifier array operating in the operation mode.

An electronic device according to various embodiments controls an output mode of a communication module depending on a state of the electronic device.

An electronic device according to various embodiments controls, in response to the electronic device being in a power saving mode, a communication module to operate in a low-power mode and thereby reduce power consumption.

An electronic device according to various embodiments controls, in response to a battery of the electronic device being in a low-power state, a communication module to operate in a low-power mode and thereby reduce power consumption.

An electronic device according to various embodiments controls, in response to a network state of the electronic device being in a strong electric field, a communication module to operate in a low-power mode and thereby reduce power consumption.

An electronic device according to various embodiments reduces power consumption of a communication module based on operation of a 5G communication system.

An electronic device according to various embodiments reduces heat generated by the electronic device when operating a 5G communication system.

An electronic device according to various embodiments extends the activation time of a 5G communication system.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 1 is a block diagram of an electronic device in a network environment according to an embodiment of the disclosure;

FIG. 8 illustrates an embodiment of an operation for a wireless communication connection between a base station and an electronic device in a second network of FIG. 2, which uses a directional beam for wireless connection according to an embodiment of the disclosure.

Throughout the drawings, it should be noted that like reference numbers are used to depict the same or similar elements, features, and structures.

DETAILED DESCRIPTION

Figure 2:
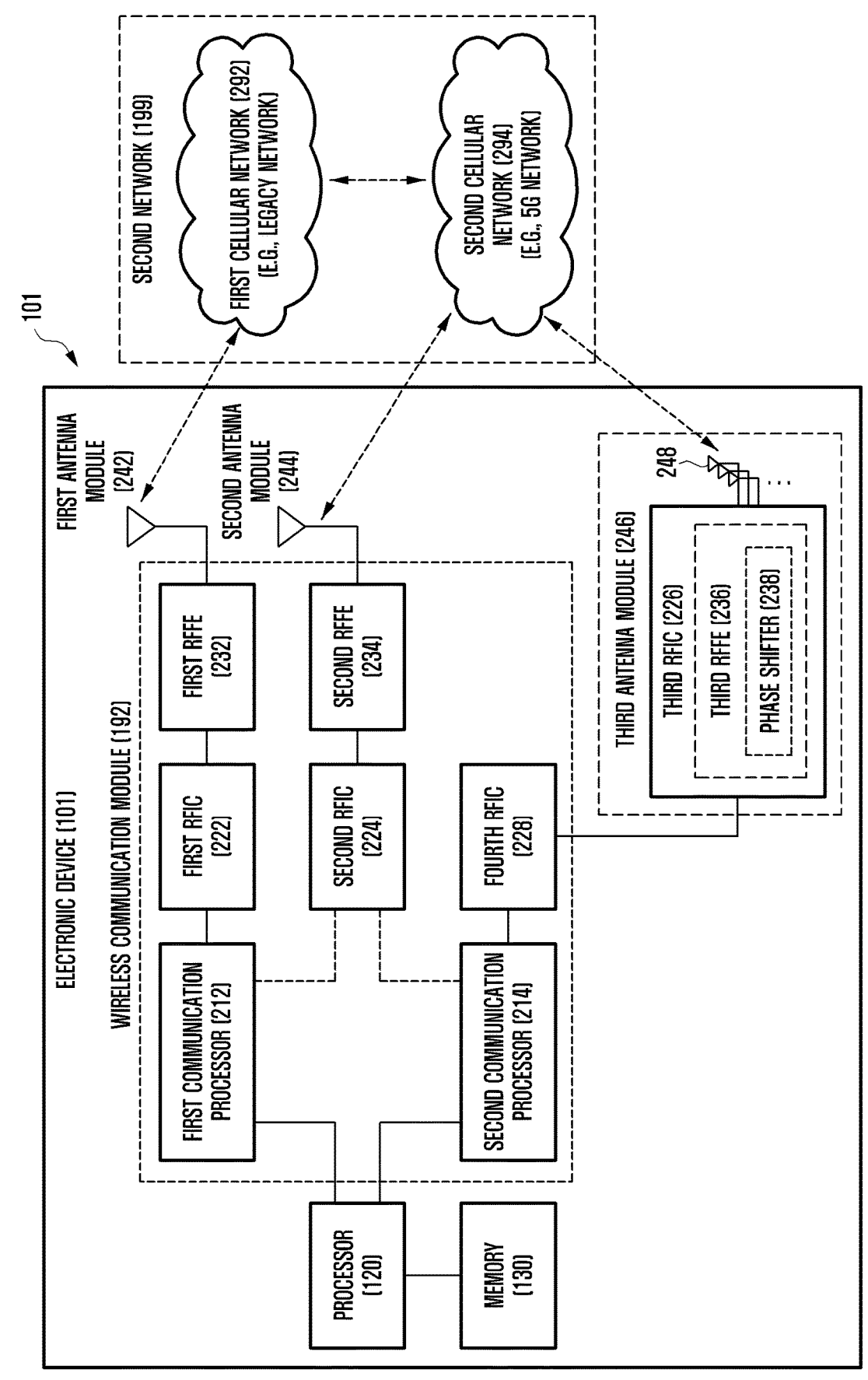
FIG. 2 is a block diagram of an electronic device for supporting legacy network communication and 5G network communication according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
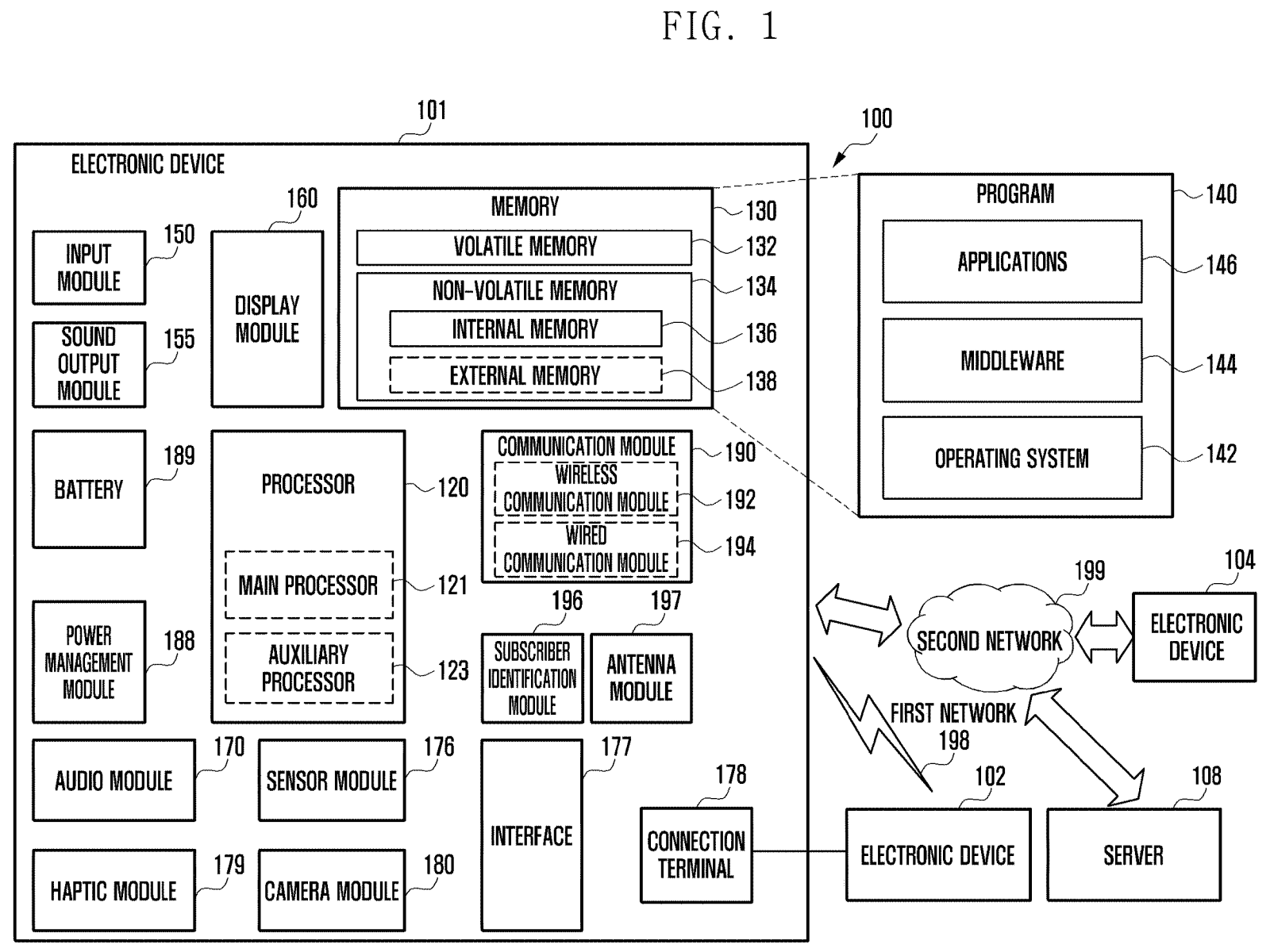

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or applications 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., the electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

The connection terminal 178 may include a connector via which the electronic device 101 may be physically connected with the external electronic device (e.g., the electronic device 102). According to an embodiment, the connection terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 gigabits per second (Gbps) or more) for implementing eMBB, loss coverage (e.g., 164 decibels (dB) or less) for implementing mMTC, or U-plane latency (e.g., 0.5 milliseconds (ms) or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices (e.g., electronic devices 102 and 104 or the server 108). For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IOT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

FIG. 2 is a block diagram illustrating an electronic device in a network environment including a plurality of cellular networks according to an embodiment of the disclosure.

Referring to FIG. 2, an electronic device 101 may include a first communication processor 212, a second communication processor 214, a first RFIC 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may include a processor 120 and a memory 130. The second network 199 may include a first cellular network 292 and a second cellular network 294. According to another embodiment, the electronic device 101 may further include at least one of the components described with reference to FIG. 1, and the second network 199 may further include at least one other network. According to one embodiment, the first communication processor 212, second communication processor 214, first RFIC 222, second RFIC 224, fourth RFIC 228, first RFFE 232, and second RFFE 234 may form at least part of the wireless communication module 192. According to another embodiment, the fourth RFIC 228 may be omitted or included as part of the third RFIC 226.

The first communication processor 212 may establish a communication channel of a band to be used for wireless communication with the first cellular network 292 and support legacy network communication through the established communication channel. According to various embodiments, the first cellular network may be a legacy network including a second generation (2G), 3G, 4G, or long term evolution (LTE) network. The second communication processor 214 may establish a communication channel corresponding to a designated band (e.g., about 6 GHz to about 60 GHZ) of bands to be used for wireless communication with the second cellular network 294, and support fifth generation (5G) network communication through the established communication channel. According to various embodiments, the second cellular network 294 may be a 5G network defined in 3rd generation partnership project (3GPP). Additionally, according to an embodiment, the first communication processor 212 or the second communication processor 214 may establish a communication channel corresponding to another designated band (e.g., about 6 GHz or less) of bands to be used for wireless communication with the second cellular network 294 and support 5G network communication through the established communication channel. According to one embodiment, the first communication processor 212 and the second communication processor 214 may be implemented in a single chip or a single package. According to various embodiments, the first communication processor 212 or the second communication processor 214 may be formed in a single chip or a single package with the processor 120, the auxiliary processor 123, or the communication module 190.

Upon transmission, the first RFIC 222 may convert a baseband signal generated by the first communication processor 212 to a radio frequency (RF) signal of about 700 MHz to about 3 GHz used in the first cellular network 292 (e.g., legacy network). Upon reception, an RF signal may be obtained from the first cellular network 292 (e.g., legacy network) through an antenna (e.g., the first antenna module 242) and be preprocessed through an RFFE (e.g., the first RFFE 232). The first RFIC 222 may convert the preprocessed RF signal to a baseband signal so as to be processed by the first communication processor 212.

Upon transmission, the second RFIC 224 may convert a baseband signal generated by the first communication processor 212 or the second communication processor 214 to an RF signal (hereinafter, 5G Sub6 RF signal) of a Sub6 band (e.g., 6 GHz or less) to be used in the second cellular network 294 (e.g., 5G network). Upon reception, a 5G Sub6 RF signal may be obtained from the second cellular network 294 (e.g., 5G network) through an antenna (e.g., the second antenna module 244) and be pretreated through an RFFE (e.g., the second RFFE 234). The second RFIC 224 may convert the preprocessed 5G Sub6 RF signal to a baseband signal so as to be processed by a corresponding communication processor of the first communication processor 212 or the second communication processor 214.

The third RFIC 226 may convert a baseband signal generated by the second communication processor 214 to an RF signal (hereinafter, 5G Above6 RF signal) of a 5G Above6 band (e.g., about 6 GHz to about 60 GHZ) to be used in the second cellular network 294 (e.g., 5G network). Upon reception, a 5G Above6 RF signal may be obtained from the second cellular network 294 (e.g., 5G network) through an antenna (e.g., the antenna 248) and be preprocessed through a third RFFE 236. The third RFIC 226 may convert the preprocessed 5G Above6 RF signal to a baseband signal so as to be processed by the second communication processor 214. According to one embodiment, the third RFFE 236 may be formed as part of the third RFIC 226.

According to an embodiment, the electronic device 101 may include a fourth RFIC 228 separately from the third RFIC 226 or as at least part of the third RFIC 226. In this case, the fourth RFIC 228 may convert a baseband signal generated by the second communication processor 214 to an RF signal (hereinafter, an intermediate frequency (IF) signal) of an intermediate frequency band (e.g., about 9 GHz to about 11 GHz) and transfer the IF signal to the third RFIC 226. The third RFIC 226 may convert the IF signal to a 5G Above 6RF signal. Upon reception, the 5G Above 6RF signal may be received from the second cellular network 294 (e.g., a 5G network) through an antenna (e.g., the antenna 248) and be converted to an IF signal by the third RFIC 226. The fourth RFIC 228 may convert an IF signal to a baseband signal so as to be processed by the second communication processor 214.

According to one embodiment, the first RFIC 222 and the second RFIC 224 may be implemented into at least part of a single package or a single chip. According to one embodiment, the first RFFE 232 and the second RFFE 234 may be implemented into at least part of a single package or a single chip. According to one embodiment, at least one of the first antenna module 242 or the second antenna module 244 may be omitted or may be combined with another antenna module to process RF signals of a corresponding plurality of bands.

According to one embodiment, the third RFIC 226 and the antenna 248 may be disposed at the same substrate to form a third antenna module 246. For example, the wireless communication module 192 or the processor 120 may be disposed at a first substrate (e.g., main PCB). In this case, the third RFIC 226 is disposed in a partial area (e.g., lower surface) of the first substrate and a separate second substrate (e.g., sub PCB), and the antenna 248 is disposed in another partial area (e.g., upper surface) thereof; thus, the third antenna module 246 may be formed. By disposing the third RFIC 226 and the antenna 248 in the same substrate, a length of a transmission line therebetween can be reduced. This may reduce, for example, a loss (e.g., attenuation) of a signal of a high frequency band (e.g., about 6 GHz to about 60 GHZ) to be used in 5G network communication by a transmission line. Therefore, the electronic device 101 may improve a quality or speed of communication with the second cellular network 294 (e.g., 5G network).

According to one embodiment, the antenna 248 may be formed in an antenna array including a plurality of antenna elements that may be used for beamforming. In this case, the third RFIC 226 may include a plurality of phase shifters 238 corresponding to a plurality of antenna elements, for example, as part of the third RFFE 236. Upon transmission, each of the plurality of phase shifters 238 may convert a phase of a 5G Above6 RF signal to be transmitted to the outside (e.g., a base station of a 5G network) of the electronic device 101 through a corresponding antenna element. Upon reception, each of the plurality of phase shifters 238 may convert a phase of the 5G Above6 RF signal received from the outside to the same phase or substantially the same phase through a corresponding antenna element. This enables transmission or reception through beamforming between the electronic device 101 and the outside.

The second cellular network 294 (e.g., 5G network) may operate (e.g., stand-alone (SA)) independently of the first cellular network 292 (e.g., legacy network) or may be operated (e.g., non-stand alone (NSA)) in connection with the first cellular network 292. For example, the 5G network may have only an access network (e.g., 5G radio access network (RAN) or a next generation (NG) RAN and have no core network (e.g., next generation core (NGC)). In this case, after accessing to the access network of the 5G network, the electronic device 101 may access to an external network (e.g., Internet) under the control of a core network (e.g., an evolved packed core (EPC)) of the legacy network. Protocol information (e.g., LTE protocol information) for communication with a legacy network or protocol information (e.g., new radio (NR) protocol information) for communication with a 5G network may be stored in the memory 130 to be accessed by other components (e.g., the processor 120, the first communication processor 212, or the second communication processor 214).

Figure 3:
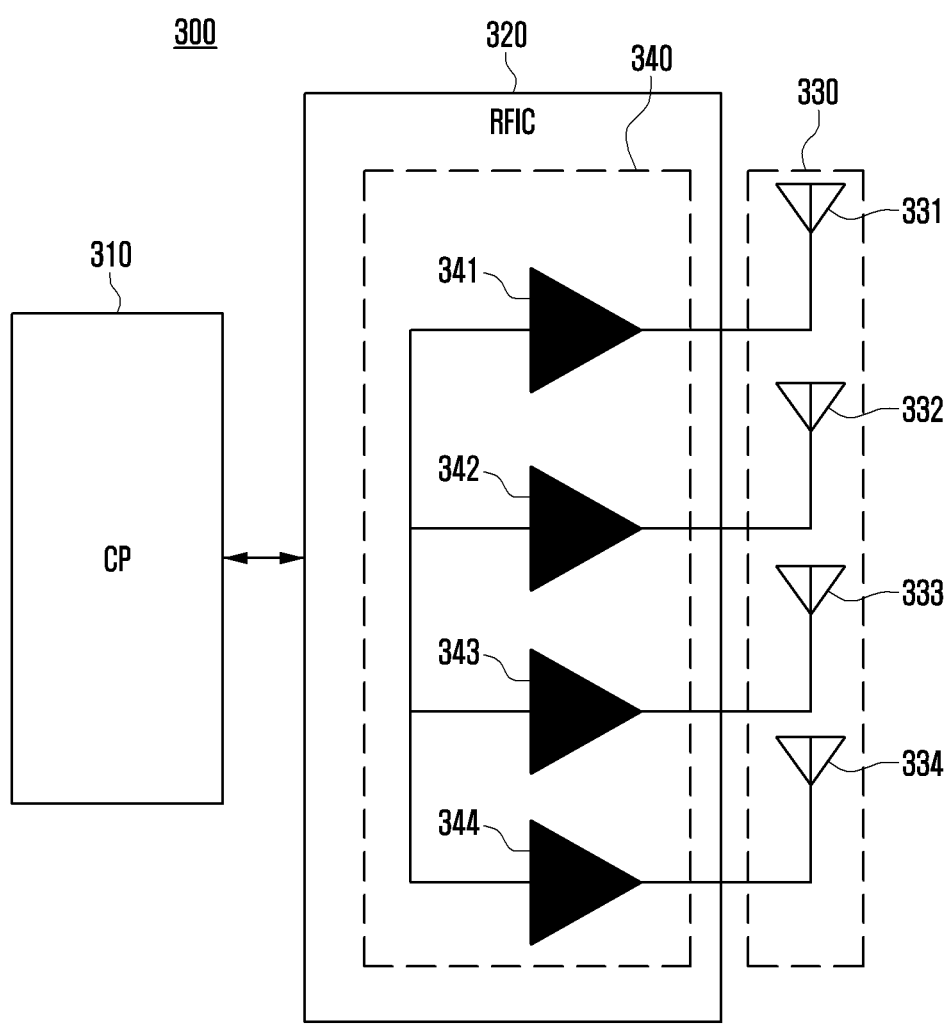
FIG. 3 is a block diagram of an electronic device according to an embodiment of the disclosure.

FIG. 3 is a block diagram of an electronic device according to an embodiment of the disclosure.

Referring to FIG. 3, an electronic device 300 (e.g., the electronic device 101 of FIG. 2) may include a communication processor 310 (e.g., the first communication processor 212 of FIG. 2 and/or the second communication processor 214 of FIG. 2), an RFIC 320 (e.g., the first RFIC 222, the second RFIC 224, and/or the fourth RFIC 228 of FIG. 2), and/or an antenna array 330 (e.g., the first antenna module 242, the second antenna module 244, or the third antenna module 246 of FIG. 2). The elements included in FIG. 3 are related to those included in the electronic device 300, and the electronic device 300 may also include various other elements as shown in FIGS. 1 and/or 2.

An amplifier array 340 according to various embodiments may include a first amplifier module 341, a second amplifier module 342, a third amplifier module 343, and/or a fourth amplifier module 344. According to an embodiment, the first amplifier module 341 and the fourth amplifier module 344 may be disposed on the outermost side of the amplifier array 340. Although the amplifier array 340 is shown as including four amplifier modules in FIG. 3, the amplifier array 340 is not limited to what is shown, and the amplifier array 340 may include n amplifier modules. Further, the first amplifier module 341 and fourth amplifier module 344 each may indicate the outermost disposed amplifier module in amplifier array 340 including n amplifier modules. For example, the first amplifier module 341 and the fourth amplifier module 344 may be connected to antennas (e.g., first antenna 331 and/or fourth antenna 334), respectively, disposed at both ends of the antenna array 330.

A detailed configuration of the amplifier modules 341, 342, 343, and 344 will be described later with reference to FIG. 4.

The communication processor 310 according to various embodiments may receive or transmit control data or user data via near field communication (e.g., Wi-Fi or Bluetooth™) or cellular wireless communication (e.g., fourth generation mobile communication or fifth generation mobile communication). The communication processor 301 may establish a cellular communication connection with a base station via the control data, may transmit data having been received from an application processor (e.g., the processor 120 of FIG. 1) to a base station via the established cellular communication, or may transmit data received from the base station to the application processor.

The communication processor 310 according to various embodiments may control the RFIC 320 based on the state of the electronic device 300.

According to various embodiments, the communication processor 310 may identify the state of the electronic device 300.

According to an embodiment, the communication processor 310 may identify an electric field state. For example, the communication processor 310 may identify the electric field state based on a received signal.

For example, the communication processor 310 may identify the state of a signal received from a base station of an operator network. The state of the signal may include the quality of the signal. The communication processor 310 may receive a signal broadcast by the base station and measure a signal quality (e.g., a received signal strength indicator (RSSI)). For example, the communication processor 310 may determine the state of the signal received from the base station of the operator network based on at least a part of information about the strength of a signal (e.g., RSSI) received from the operator network, transmission and reception rate information of a signal transmitted from the operator network, transmission failure rate information of the signal transmitted from the operator network, signal to noise ratio (SNR) information of the signal transmitted from the operator network, perceptual evaluation of speech quality-wideband (PESQ-WB) information of the signal transmitted from the operator network, and perceptual objective listening quality assessment (POLQA) information of the signal transmitted from the operator network.

For example, the communication processor 310 may determine a network state as a weak electric field, a medium electric field, and/or a strong electric field based on the state of a signal received from a base station of the operator network.

For example, the strong electric field may be a network state in case that the reference signal received power (RSRP) is in a first range (e.g., −50 dBm to −70 dBm), the reference signal received quality (RSRQ) is in a first range (e.g., −2 dBm to −7 dBm), or the signal to interference and noise ratio (SINR) is in a first range (e.g., 25 dBm to 30 dBm), the medium field may be a network state in case that the RSRP is in a second range (e.g., −70 dBm to −85 dBm), the RSRQ is in a second range (e.g., −7 dBm to −13 dBm), or the SINR is in a second range (e.g., 15 dBm to 25 dBm), and the weak field may be a network state in case that the RSRP is in a third range (e.g., less than −85 dBm), the RSRQ is in a third range (e.g., less than −13 dBm), or the SINR is in a third range (e.g., less than 15 dBm).

According to an embodiment, the communication processor 310 may identify the power mode of the electronic device 300. The power mode may include a high-performance mode for improving the task processing speed of the electronic device 300, a power saving mode for reducing battery power consumption while reducing the task processing speed of the electronic device 300, and/or a normal mode. For example, the communication processor 310 may receive information indicating a power mode configured in the electronic device 300 from a processor (e.g., the processor 120 of FIG. 1), and may identify the power mode of the electronic device 300. For example, the power mode of the electronic device 300 may be a power saving mode, which is a power mode that may be configured to reduce power consumption compared to when the electronic device 300 is in a default state.

According to an embodiment, the communication processor 310 may identify a battery state of the electronic device 300. The battery state may include a high charge state in which a residual amount of the battery (e.g., the battery 189 of FIG. 1) is greater than or equal to a designated value and/or a low charge state in which a residual amount of the battery is less than a specified value. For example, the communication processor 310 may receive information indicating a battery state of the electronic device 300, identified from a power management module (e.g., the power management module 188 of FIG. 1) and/or a battery (e.g., the battery 189 of FIG. 1), and may identify the battery state. For example, the communication processor 310 may identify that the battery is in a low charge state in response to a residual battery amount being equal to or less than a designated value.

The communication processor 310 according to various embodiments may determine an operation mode of the amplifier array 340 that corresponds to the state of the electronic device.

The communication processor 310 according to an embodiment may determine the operation mode of the amplifier array 340 as one operation mode among a first operation mode, a second operation mode, and/or a third operation mode. For example, the operation mode of the amplifier array 340 may be a mode in which the output modes of the amplifier modules included in the amplifier array 340 are configured differently. For example, the operation mode of the amplifier array 340 may be a mode in which the output modes of amplifier modules included in the amplifier array 340 are configured to operate in a high-power mode and/or a low-power mode. For example, the high-power mode may be a mode in which the amplifier module operates with a gain of designated value (e.g., 20 dB), and the low-power mode may be a mode in which the amplifier module operates with a gain of designated value (e.g., −10 dB), the low-power mode operating at a gain of value relatively lower than that of the high-power mode.

According to an embodiment, the first operation mode may be a default mode of the amplifier array 340.

For example, the first operation mode may be an operation mode of the amplifier array 340 in which the first amplifier module 341, the second amplifier module 342, the third amplifier module 343, and the fourth amplifier module 344 are in a high-power mode. For example, the second operation mode may be an operation mode of the amplifier array 340 in which the second amplifier module 342 and the third amplifier module 343 are in a high-power mode and the first amplifier module 341 and the fourth amplifier module 344 are in a low-power mode. For example, the third operation mode may be an operation mode of the amplifier array 340 in which the first amplifier module 341, the second amplifier module 342, the third amplifier module 343, and the fourth amplifier module 344 are in a low-power mode.

The communication processor 310 according to an embodiment may determine an operation mode of the amplifier array 340 that corresponds to a power mode of the electronic device. For example, the communication processor 310 may determine an operation mode of the amplifier array 340 to be a second operation mode in response to the electronic device 300 being in a power saving mode. For example, the communication processor 310 may obtain a lookup table associated with a target power corresponding to the second operation mode from a memory (e.g., the memory 130 of FIGS. 1 and/or 2) in response to the electronic device 300 being in a power saving mode.

For example, the communication processor 310 may determine the operation mode of the amplifier array 340 to be the third operation mode in response to the battery of the electronic device 300 being in a low charge state. For example, the communication processor 310 may obtain a lookup table associated with a target power corresponding to the third operation mode from the memory 130 in response to the battery of the electronic device 300 being in a low charge state.

The communication processor 310 according to an embodiment may determine an operation mode of the amplifier array 340 that corresponds to a network state of the electronic device 300. For example, the communication processor 310 may determine an operation mode of the amplifier array 340 to be a first operation mode in response to a network state of the electronic device 300 being in a weak electric field. For example, the communication processor 310 may obtain a lookup table associated with a target power corresponding to the first operation mode from the memory 130 in response to the network state of the electronic device 300 being in a weak electric field. For example, the communication processor 310 may determine an operation mode of the amplifier array 340 to be a second operation mode in response to the network state of the electronic device 300 being in a medium electric field. For example, the communication processor 310 may obtain a lookup table associated with a target power corresponding to the second operation mode from the memory 130 in response to the network state of the electronic device 300 being in a medium electric field. For example, the communication processor 310 may determine the operation mode of the amplifier array 340 to be a third operation mode in response to the network state of the electronic device 300 being in a strong electric field. For example, the communication processor 310 may obtain a lookup table associated with a target power corresponding to the third operation mode from the memory 130 in response to the network state of the electronic device 300 being in a strong electric field.

According to an embodiment, the communication processor 310 may obtain, from the memory 130, a lookup table associated with a target power in response to an operation mode. The target power may be the power of a beam, which is formed by radiating a signal, having been amplified by the amplifier array 340, from the antenna array 330.

The lookup table according to an embodiment may include information associated with the input power of the amplifier array 340 corresponding to the target power and the settings of the amplifier modules. Table 1 is an example of a lookup table associated with a target power corresponding to a first operation mode (e.g., where the first amplifier module 341, the second amplifier module 342, the third amplifier module 343, and the fourth amplifier module 344 operate in a high-power mode (e.g., a mode operating at a gain of 20 dB)), and each number has the unit of dBM.

TABLE 1

| Output power | First amplifier module | Second amplifier module | Third amplifier module | Fourth amplifier module | Target power |
|---|---|---|---|---|---|
| −5 | 15 | 15 | 15 | 15 | 21 |
| −6 | 14 | 14 | 14 | 14 | 20 |
| −7 | 13 | 13 | 13 | 13 | 19 |
| −8 | 12 | 12 | 12 | 12 | 18 |
| −9 | 11 | 11 | 11 | 11 | 17 |
| −10 | 10 | 10 | 10 | 10 | 16 |
| −11 | 9 | 9 | 9 | 9 | 15 |
| −12 | 8 | 8 | 8 | 8 | 14 |
| −13 | 7 | 7 | 7 | 7 | 13 |
| −14 | 6 | 6 | 6 | 6 | 12 |
| −15 | 5 | 5 | 5 | 5 | 11 |
| −16 | 4 | 4 | 4 | 4 | 10 |
| −17 | 3 | 3 | 3 | 3 | 9 |
| −18 | 2 | 2 | 2 | 2 | 8 |
| −19 | 1 | 1 | 1 | 1 | 7 |
| −20 | 0 | 0 | 0 | 0 | 6 |

Table 2 is an example of a lookup table related to target power corresponding to a second operation mode (e.g., where the second amplifier module 342 and the third amplifier module 343 are in a high-power mode (e.g., a mode operating at a gain of 20 dB)), and the first amplifier module 341 and the fourth amplifier module 344 are in a low-power mode (e.g., a mode operating at a gain of 10 dB)), and each number has the unit of dBM.

TABLE 2

| Output power | First amplifier module | Second amplifier module | Third amplifier module | Fourth amplifier module | Target power |
|---|---|---|---|---|---|
| −2 | 8 | 18 | 18 | 8 | 21 |
| −3 | 7 | 17 | 17 | 7 | 20 |
| −4 | 6 | 16 | 16 | 6 | 19 |
| −5 | 5 | 15 | 15 | 5 | 18 |
| −6 | 4 | 14 | 14 | 4 | 17 |
| −7 | 3 | 13 | 13 | 3 | 16 |
| −8 | 2 | 12 | 12 | 2 | 15 |
| −9 | 1 | 11 | 11 | 1 | 14 |
| −10 | 0 | 10 | 10 | 0 | 13 |
| −11 | −1 | 9 | 9 | −1 | 12 |
| −12 | −2 | 8 | 8 | −2 | 11 |

TABLE 2-continued

| Output power | First amplifier module | Second amplifier module | Third amplifier module | Fourth amplifier module | Target power |
|---|---|---|---|---|---|
| −13 | −3 | 7 | 7 | −3 | 10 |
| −14 | −4 | 6 | 6 | −4 | 9 |
| −15 | −5 | 5 | 5 | −5 | 8 |
| −16 | −6 | 4 | 4 | −6 | 7 |
| −17 | −7 | 3 | 3 | −7 | 6 |

Table 3 is an example of a lookup table related to a target power corresponding to a third operation mode (e.g., a mode in which the first amplifier module 341, the second amplifier module 342, the third amplifier module 343, and the fourth amplifier module 344 operate in a low-power mode (e.g., a mode operating at a gain of 10 dB)), and each number has the unit of dBM.

TABLE 3

| Output power | First amplifier module | Second amplifier module | Third amplifier module | Fourth amplifier module | Target power |
|---|---|---|---|---|---|
| 5 | 15 | 15 | 15 | 15 | 21 |
| 4 | 14 | 14 | 14 | 14 | 20 |
| 3 | 13 | 13 | 13 | 13 | 19 |
| 2 | 12 | 12 | 12 | 12 | 18 |
| 1 | 11 | 11 | 11 | 11 | 17 |
| 0 | 10 | 10 | 10 | 10 | 16 |
| −1 | 9 | 9 | 9 | 9 | 15 |
| −2 | 8 | 8 | 8 | 8 | 14 |
| −3 | 7 | 7 | 7 | 7 | 13 |
| −4 | 6 | 6 | 6 | 6 | 12 |
| −5 | 5 | 5 | 5 | 5 | 11 |
| −6 | 4 | 4 | 4 | 4 | 10 |
| −7 | 3 | 3 | 3 | 3 | 9 |
| −8 | 2 | 2 | 2 | 2 | 8 |
| −9 | 1 | 1 | 1 | 1 | 7 |
| −10 | 0 | 0 | 0 | 0 | 6 |

Table 4 is a table showing comparison of an input power and gains corresponding to the modes in which the first amplifier module 341, second amplifier module 342, third amplifier module 343, and fourth amplifier module 344 operate in response to an operation mode, with respect to the same target power.

TABLE 4

| operation mode | Input power | First amplifier module | Second amplifier module | Third amplifier module | Fourth amplifier module | Target power |
|---|---|---|---|---|---|---|
| First operation mode | −6 dBM | 20 dB | 20 dB | 20 dB | 20 dB | 20 dBM |
| Second operation mode | −3 dBM | 20 dB | 20 dB | 20 dB | 20 dB | |
| Third operation mode | 4 dBM | 10 dB | 10 dB | 10 dB | 10 dB | |
| First operation mode | −11 dBM | 20 dB | 20 dB | 20 dB | 20 dB | 15 dBM |
| Second operation mode | −8 dBM | 20 dB | 20 dB | 20 dB | 20 dB | |
| Third operation mode | −1 dBM | 10 dB | 10 dB | 10 dB | 10 dB | |
| First operation mode | −16 dBM | 20 dB | 20 dB | 20 dB | 20 dB | 10 dBM |

TABLE 4-continued

| operation mode | Input power | First amplifier module | Second amplifier module | Third amplifier module | Fourth amplifier module | Target power |
|---|---|---|---|---|---|---|
| Second operation mode | −13 dBM | 20 dB | 20 dB | 20 dB | 20 dB | |
| Third operation mode | −6 dBM | 10 dB | 10 dB | 10 dB | 10 dB | |

The communication processor 310 according to an embodiment may identify an input power corresponding to a target power based on a lookup table according to an operation mode. For example, the communication processor 310 may identify an input power of −5 dBM from the lookup table to output a target power of 21 dBM in the first operation mode. For example, the communication processor 310 may identify the input power of −5 dBM from the look-up table to output a target power of 18 dBM in the second operation mode. For example, the communication processor 310 may identify the input power of −5 dBM from the look-up table to output a target power of 11 dBM in the third operation mode. The communication processor 310 according to various embodiments may control the amplifier modules based on the determined operation mode of the amplifier array 340.

According to an embodiment, the communication processor 310 may control the amplifier modules 341, 342, 343, and 344 such that each of the amplifier modules 341, 342, 343, and 344 operates in a high-power mode and/or a low-power mode, based on the determined operation mode of the amplifier array 340.

For example, the communication processor 310 may, in response to the operation mode of the amplifier array 340 being in a first mode, control the first amplifier module 341, the second amplifier module 342, the third amplifier module 343, and the fourth amplifier module 344 to operate in a high-power mode.

For example, the communication processor 310 may, in response to the operation mode of the amplifier array 340 being in a second mode, control the first amplifier module 341, the second amplifier module 342, the third amplifier module 343, and the fourth amplifier module 344 such that the second amplifier module 342 and the third amplifier module 343 operate in a high-power mode and the first amplifier module 341 and the fourth amplifier module 344 operate in a low-power mode.

For example, the communication processor 310 may, in response to the operation mode of the amplifier array 340 being in a third mode, control the first amplifier module 341, the second amplifier module 342, the third amplifier module 343, and the fourth amplifier module 344 to operate in a low-power mode.

The communication processor 310 according to an embodiment may control the amplifier array 340 according to an input power corresponding to a target power, based on a lookup table according to an operation mode.

For example, the communication processor 310 configures the input power to be −5 dBM to output a target power of 21 dBM in the first operation mode, and may control the amplifier array 340 such that the first amplifier module 341 operates in a high-power mode to output power of 15 dBM, the second amplifier module 342 operates in a high-power mode to output power of 15 dBM, the third amplifier module

343 operates in a high-power mode to output power of 15 dBM, and the fourth amplifier module 344 operates in a high-power mode to output power of 15 dBM.

For example, the communication processor 310 configures the input power to be −5 dBM to output a target power of 18 dBM in the second operation mode, and may control the amplifier array 340 such that the first amplifier module 341 operates in a low-power mode to output power of 5 dBM, the second amplifier module 342 operates in a high-power mode to output power of 15 dBM, the third amplifier module 343 operates in a high-power mode to output power of 15 dBM, and the fourth amplifier module 344 operates in a low-power mode to output power of 5 dBM.

For example, the communication processor 310 may configure the input power to be −5 dBM to output a target power of 11 dBM in the third operation mode, and may control the amplifier array 340 such that the first amplifier module 341 operates in a low-power mode to output power of 5 dBM, the second amplifier module 342 operates in a low-power mode to output power of 5 dBM, the third amplifier module 343 operates in a low-power mode to output power of 5 dBM, and the fourth amplifier module 344 operates in a low-power mode to output power of 5 dBM.

The RFIC 320 according to various embodiments may perform various operations to process the acquired signal.

The RFIC 320 according to an embodiment may perform various operations to process a signal received from the communication processor 310. For example, the RFIC 320 may perform a modulation operation on the signal received from the communication processor 310. For example, the RFIC 320 may perform a frequency modulation operation to convert a baseband signal to a radio frequency (RF) signal used for cellular communications.

The RFIC 320 according to various embodiments may include a radio frequency front end (RFFE) (e.g., first RFFE 232 and/or second RFFE 234 of FIG. 2).

The RFFE according to an embodiment may include at least one RF chain for outputting a signal through the antenna array 330. For example, the RF chain may refer to a set of various components included in the path of travel of a signal. The RF chain may include, for example, various components (e.g., amplifiers, switches, or filters) that perform operations to amplify the signal acquired by the RFIC 320 and filter the amplified signal.

According to various embodiments, the RFFE may include an amplifier array 340 for amplifying signals in a frequency band. The amplifier array 340 may be a component included in the RF chain. The amplifier array 340 may include one or more amplifier modules 341, 342, 343, and 344 that amplify the signal.

The antenna array 330 according to various embodiments may transmit or receive signals to or from an external electronic device. The antenna array 330 may transmit signals, obtained by converting baseband signals into radio frequency (RF) signals by the RFIC 320 and performing amplification and processing of the same, to the outside. For example, the antenna array 330 may include mmWave antennas for 5G communication. For example, the antenna array 330 may radiate the acquired signals outside in the form of a beam.

The antenna array 330 according to an embodiment may include a first antenna 331, a second antenna 332, a third antenna 333, and/or a fourth antenna 334. For example, the first antenna 331 may be connected to the first amplifier module 341 to transmit a signal amplified by the first amplifier module 341 to the outside, the second antenna 332 may be connected to the second amplifier module 342 to transmit a signal amplified by the second amplifier module 342 to the outside, the third antenna 333 may be connected to a third amplifier module 343 to transmit a signal amplified by the third amplifier module 343 to the outside, and the fourth antenna 334 may be connected to a fourth amplifier module 344 to transmit a signal amplified by the fourth amplifier module 344 to the outside. For example, the antenna array 330 may radiate a synthesized beam obtained by synthesizing beams generated by the first antenna 331, the second antenna 332, the third antenna 333, and/or the fourth antenna 334 to the outside.

Although FIG. 3 shows four amplifier modules 341, 342, 343, and 344 and four antennas 331, 332, 333, and 334, the electronic device 300 may include fewer or more amplifier modules and antennas.

Figure 4:
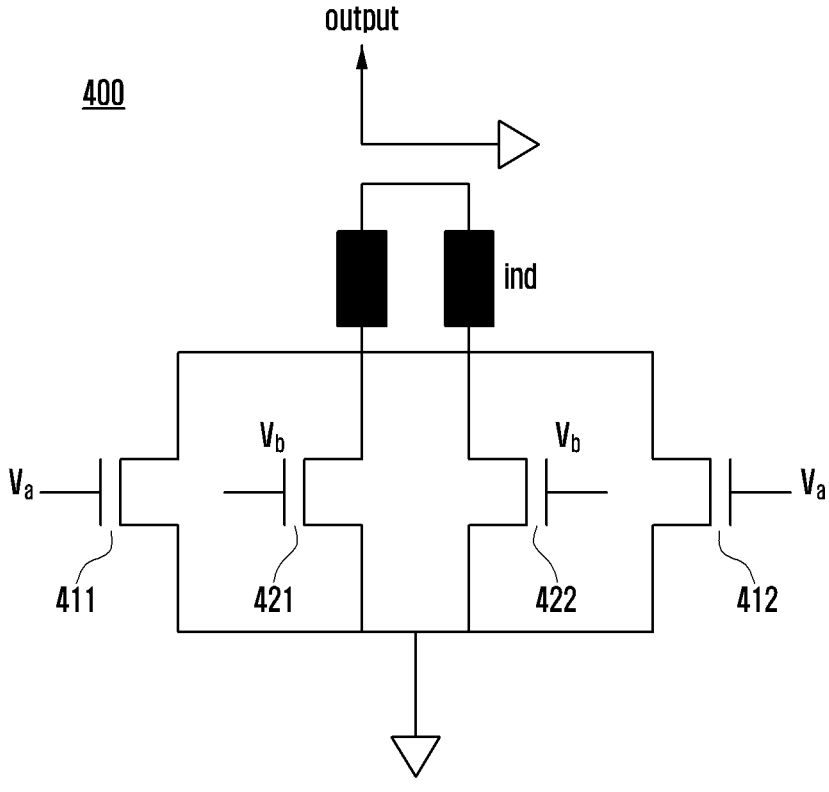
FIG. 4 illustrates a communication circuit included in an amplifier module according to an embodiment of the disclosure.

FIG. 4 illustrates a communication circuit included in an amplifier module according to an embodiment of the disclosure.

Referring to FIGS. 3 and 4, according to various embodiments, a communication circuit 400 may be a communication circuit included in the first amplifier module 341, the second amplifier module 342, the third amplifier module 343, and/or the fourth amplifier module 344 included in the amplifier array 340 of FIG. 3.

Referring to FIG. 4, according to various embodiments, a communication circuit 400 may include a first transistor cell 411, 412 and/or a second transistor cell 421, 422. The second transistor cell 421, 422 according to an embodiment may be relatively larger in size than the first transistor cell 411, 412 and accordingly, may have a relatively higher power output and greater power consumption than the first transistor cell 411, 412.

According to an embodiment, the communication circuit 400 may include a bias circuit (not shown) to provide a bias current to the first transistor cell 411, 412 and/or the second transistor cell 421, 422. For example, the first transistor cell 411, 412 may operate at a first bias (Va), and the second transistor cell 421, 422 may operate at a second bias (Vb).

According to various embodiments, the communication circuit 400 may perform control to amplify a signal in the first transistor cell 411, 412 or the second transistor cell 421, 422, based on the output mode of the amplifier module.

Although the first transistor cell 411, 412 and the second transistor cell 421, 422 are illustrated in FIG. 4 to include two transistors, without limitation thereto, the first transistor cell 411 or 412 and the second transistor cell 421 or 422 according to various embodiments may include one transistor.

For example, the communication circuit 400 may perform control to apply a first bias (Va) in a low-power mode to amplify a signal in the first transistor cell 411, 412. For example, the communication circuit 400 may perform control to apply a second bias (Vb) in a high-power mode to amplify a signal in the second transistor cell 421, 422.

Figure 5:
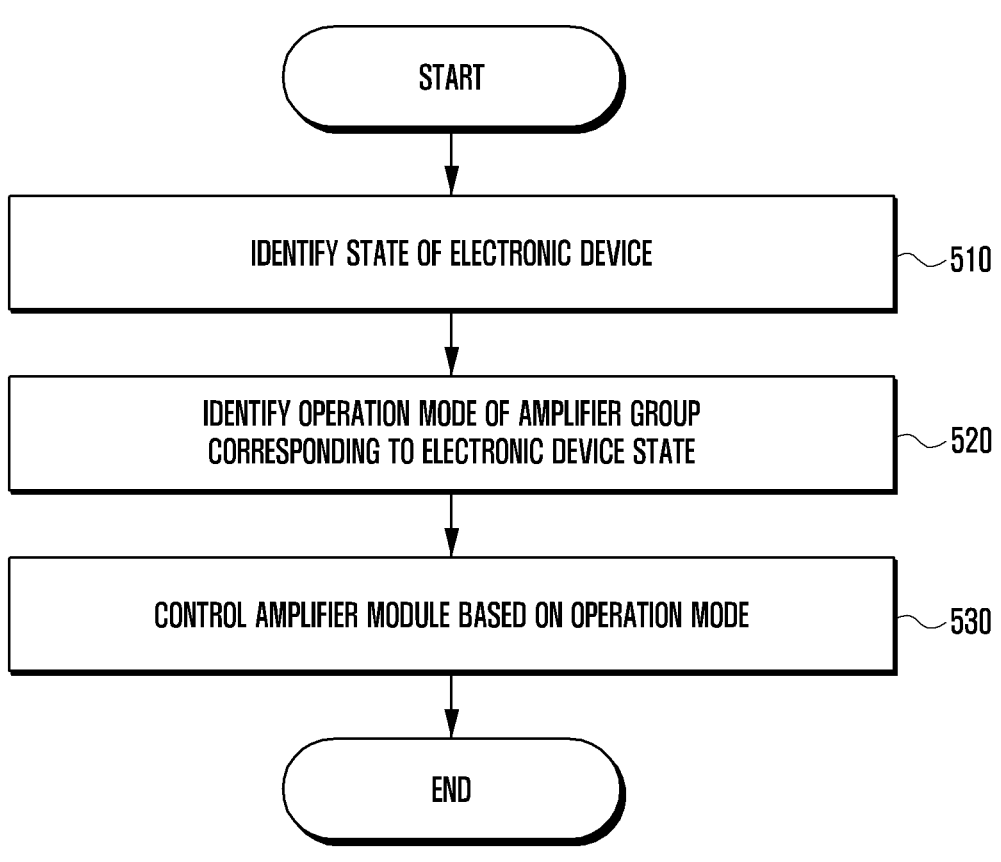
FIG. 5 is a flowchart illustrating a method in which a communication processor controls an amplifier array based on an operation mode according to an embodiment of the disclosure.

FIG. 5 is a flowchart illustrating a method in which a communication processor (e.g., the communication processor 310 of FIG. 3) controls an amplifier group (e.g., the amplifier array 340 of FIG. 3) based on an operation mode according to an embodiment of the disclosure.

Referring to FIG. 5, a communication processor 310 according to various embodiments may identify the state of an electronic device 300, in operation 510.

According to an embodiment, the communication processor 310 may identify the state of an electric field. For example, the communication processor 310 may identify the electric field state based on a received signal.

For example, the communication processor 310 may identify the state of a signal received from a base station of an operator network. The state of the signal may include the quality of the signal. The communication processor 310 may receive a signal broadcast by a base station and measure a signal quality (e.g., a received signal strength indicator (RSSI)). For example, the communication processor 310 may determine the state of the signal received from the base station of the operator network based on at least a part of information about the strength of a signal (e.g., RSSI) received from the operator network, transmission and reception rate information of a signal transmitted from the operator network, transmission failure rate information of the signal transmitted from the operator network, signal to noise ratio (SNR) information of the signal transmitted from the operator network, perceptual evaluation of speech quality-wideband (PESQ-WB) information of the signal transmitted from the operator network, and perceptual objective listening quality assessment (POLQA) information of the signal transmitted from the operator network.

For example, the communication processor 310 may determine a network state as a weak electric field, a medium electric field, and/or a strong electric field based on the state of a signal received from a base station of the operator network.

For example, the strong electric field may be a network state in case that the RSRP is in a first range (e.g., −50 dBm to −70 dBm), the RSRQ is in a first range (e.g., −2 dBm to −7 dBm), or the SINR is in a first range (e.g., 25 dBm to 30 dBm), the medium field may be a network state in case that the RSRP is in a second range (e.g., −70 dBm to −85 dBm), the RSRQ is in a second range (e.g., −7 dBm to −13 dBm), or the SINR is in a second range (e.g., 15 dBm to 25 dBm), and the weak field may be a network state in case that the RSRP is in a third range (e.g., less than −85 dBm), the RSRQ is in a third range (e.g., less than −13 dBm), or the SINR is in a third range (e.g., less than 15 dBm).

According to an embodiment, the communication processor 310 may identify the power mode of the electronic device 300. The power mode may include a high-performance mode for improving the task processing speed of the electronic device 300, a power saving mode for reducing battery power consumption while reducing the task processing speed of the electronic device 300, and/or a normal mode. For example, the communication processor 310 may receive information indicating a power mode configured in the electronic device 300 from a processor (e.g., the processor 120 of FIG. 1), and may identify the power mode of the electronic device 300. For example, the power mode of the electronic device 300 may be a power saving mode, which is a power mode that may be configured to reduce power consumption compared to when the electronic device 300 is in a default state.

According to an embodiment, the communication processor 310 may identify a battery state of the electronic device

300. The battery state may include a high charge state in which a residual amount of the battery (e.g., the battery 189 of FIG. 1) is greater than or equal to a designated value and/or a low charge state in which a residual amount of the battery is less than a specified value. For example, the communication processor 310 may receive information indicating the battery state of the electronic device 300, identified from a power management module (e.g., the power management module 188 of FIG. 1) and/or a battery (e.g., the battery 189 of FIG. 1), and may identify the battery state. For example, the communication processor 310 may identify that the battery is in a low charge state in response to a residual battery amount being equal to or less than a designated value.

The communication processor 310 according to various embodiments may identify an operation mode of the amplifier array 340 that corresponds to the state of the electronic device 300, in operation 520.

The communication processor 310 according to an embodiment may determine the operation mode of the amplifier array 340 as one operation mode among a first operation mode, a second operation mode, and/or a third operation mode. For example, the operation mode of the amplifier array 340 may be a mode in which the output modes of the amplifier modules included in the amplifier array 340 are configured differently. For example, the operation mode of the amplifier array 340 may be a mode in which the output modes of amplifier modules included in the amplifier array 340 are configured to operate in a high-power mode and/or a low-power mode. For example, the high-power mode may be a mode in which the amplifier module operates with a gain of designated value (e.g., 20 dB), and the low-power mode may be a mode in which the amplifier module operates with a gain of designated value (e.g., −10 dB), the low-power mode operating at a gain of value relatively lower than that of the high-power mode.

For example, the first operation mode may be an operation mode of the amplifier array 340 in which the first amplifier module 341, the second amplifier module 342, the third amplifier module 343, and the fourth amplifier module 344 are in a high-power mode. For example, the second operation mode may be an operation mode of the amplifier array 340 in which the second amplifier module 342 and the third amplifier module 343 are in a high-power mode and the first amplifier module 341 and the fourth amplifier module 344 are in a low-power mode. For example, the third operation mode may be an operation mode of the amplifier array 340 in which the first amplifier module 341, the second amplifier module 342, the third amplifier module 343, and the fourth amplifier module 344 are in a low-power mode.

The communication processor 310 according to an embodiment may determine an operation mode of the amplifier array 340 that corresponds to a power mode of the electronic device. For example, the communication processor 310 may determine an operation mode of the amplifier array 340 to be a second operation mode in response to the electronic device 300 being in a power saving mode. For example, the communication processor 310 may determine the operation mode of the amplifier array 340 to be a third operation mode in response to the battery of the electronic device 300 being in a low charge state.

The communication processor 310 according to an embodiment may determine an operation mode of the amplifier array 340 that corresponds to a network state of the electronic device 300. For example, the communication processor 310 may determine an operation mode of the amplifier array 340 to be a first operation mode in response to a network state of the electronic device 300 being in a weak electric field. For example, the communication processor 310 may determine an operation mode of the amplifier array 340 to be a second operation mode in response to the network state of the electronic device 300 being in a medium electric field. For example, the communication processor 310 may determine the operation mode of the amplifier array 340 to be a third operation mode in response to the network state of the electronic device 300 being in a strong electric field.

According to an embodiment, the communication processor 310 may obtain, from a memory (e.g., the memory 130 of FIGS. 1 and 2), a lookup table associated with a target power in response to an operation mode. The lookup table according to an embodiment may include information associated with the input power of the amplifier array 340 corresponding to the target power and the settings of the amplifier modules.

The communication processor 310 according to various embodiments may control amplifier modules (e.g., the amplifier modules 341, 342, 343, and 344 of FIG. 3) based on the operation mode of the amplifier array 340, in operation 530.

According to an embodiment, the communication processor 310 may control the amplifier modules 341, 342, 343, and 344 such that each of the amplifier modules 341, 342, 343, and 344 operates in a high-power mode and/or a low-power mode, based on the determined operation mode of the amplifier array 340.

For example, the communication processor 310 may, in response to the operation mode of the amplifier array 340 being in a first mode, control the first amplifier module 341, the second amplifier module 342, the third amplifier module 343, and the fourth amplifier module 344 to operate in a high-power mode.

For example, the communication processor 310 may, in response to the operation mode of the amplifier array 340 being in a second mode, control the first amplifier module 341, the second amplifier module 342, the third amplifier module 343, and the fourth amplifier module 344 such that the second amplifier module 342 and the third amplifier module 343 operate in a high-power mode and the first amplifier module 341 and the fourth amplifier module 344 operate in a low-power mode.

For example, the communication processor 310 may, in response to the operation mode of the amplifier array 340 being in a third mode, control the first amplifier module 341, the second amplifier module 342, the third amplifier module 343, and the fourth amplifier module 344 to operate in a low-power mode.

The communication processor 310 according to an embodiment may control, based on a lookup table, the amplifier array 340 according to an input power and an operation mode of the amplifier array 340 corresponding to a target power.

According to various embodiments, the communication circuit 400 may perform control to amplify a signal in the first transistor cell 411, 412 or the second transistor cell 421, 422, based on the output mode of the amplifier module.

For example, the communication circuit 400 may perform control to apply a first bias (Va) in a low-power mode to amplify a signal in the first transistor cell 411, 412. For example, the communication circuit 400 may perform control to apply a second bias (Vb) in a high-power mode to amplify a signal in the second transistor cell 421, 422.

Figure 6:
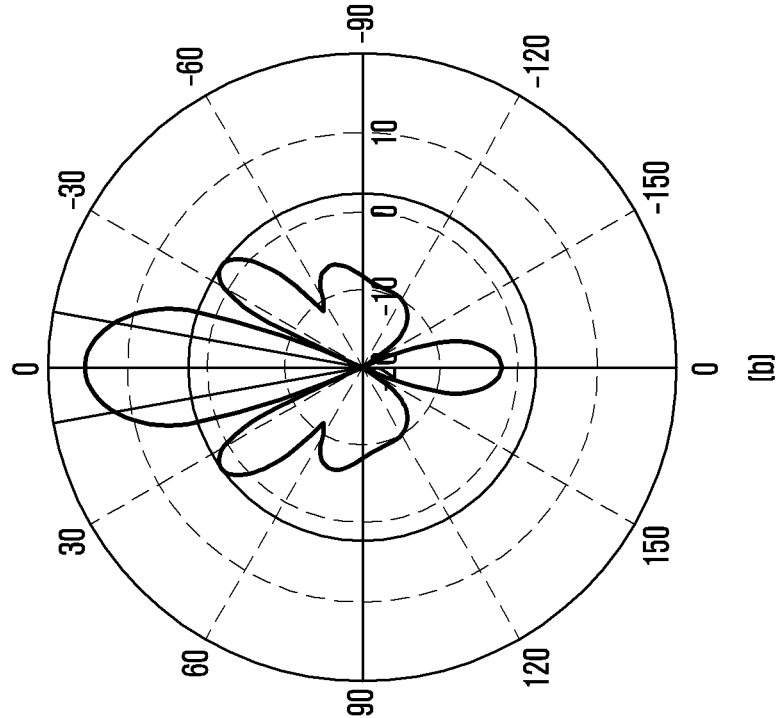
FIG. 6 illustrates a synthesized beam corresponding to an operation mode according to an embodiment of the disclosure.
Figure 6:
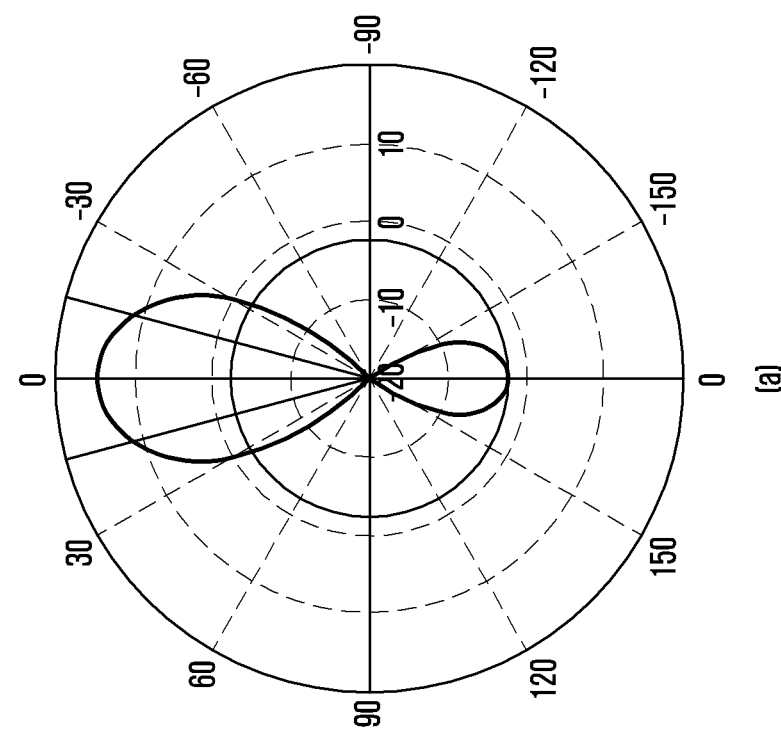

FIG. 6 illustrates a synthesized beam corresponding to an operation mode of an amplifier array (e.g., the amplifier array 340 of FIG. 3) according to an embodiment of the disclosure.

Referring to FIG. 6, part (a) of FIG. 6 may be a synthesized beam emitted from the antenna array 330 in response to the amplifier array 340 operating in a second operation mode, and part (b) of FIG. 6 may be a synthesized beam emitted from the antenna array 330 in response to the amplifier array 340 operating in a default mode (e.g., a first operation mode).

Referring to part (a) of FIG. 6, the synthesized beam in the second operation mode, in which some of the amplifier modules included in the amplifier array 340 (e.g., the first amplifier module 341 and the fourth amplifier module 344) are in a low-power mode, may not have a significant difference in shape compared to the synthesized beam in the default mode, in which all of the amplifier modules included in the amplifier array 340 are in a high-power mode, as shown in part (b) of FIG. 6.

According to various embodiments, a memory (e.g., the memory 130 of FIGS. 1 and/or 2) may store a lookup table FIG. 3) according to an embodiment may control each of antennas (e.g., the antennas 331, 332, 333, and 334 included in the antenna array 330 in FIG. 3) based on the lookup table associated with the beam book according to the operation mode.

Figure 7:
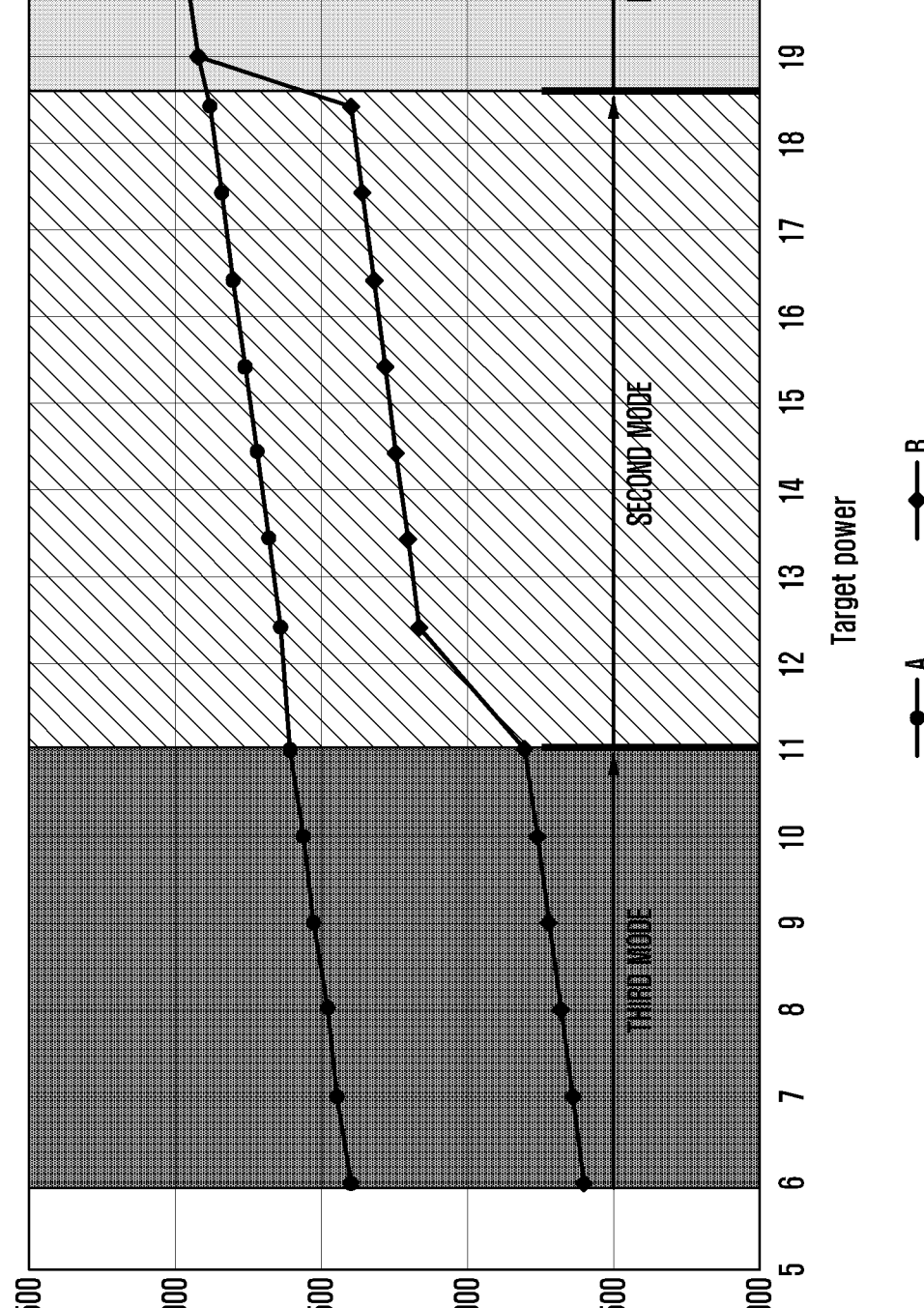
FIG. 7 is a graph illustrating power consumption in an amplifier array based on a target power, in response to an operation mode according to an embodiment of the disclosure.

FIG. 7 is a graph illustrating power consumption in the amplifier array 340 based on a target power, in response to an operation mode according to an embodiment of the disclosure.

Referring to FIG. 7, an x-axis represents a target power and an y-axis represents power consumption, "A" may be a graph in case that the amplifier array 340 is operating in a default mode (e.g., a first operation mode), and "B" may be a graph in case that the amplifier array 340 changes an operation mode in response to a state of the electronic device 300.

Table 5 is a table showing values corresponding to graph A and graph B.

TABLE 5

| Target power | Operation mode | First amplifier | Second amplifier | Third amplifier | Fourth amplifier | Total consumption current |
|---|---|---|---|---|---|---|
| | | | Graph A | | | |
| 21 | First | 1000 | 1000 | 1000 | 1000 | 4000 |
| 20 | operation | 990 | 990 | 990 | 990 | 3960 |
| 19 | mode | 980 | 980 | 980 | 980 | 3920 |
| 18 | | 970 | 970 | 970 | 970 | 3880 |
| 17 | | 960 | 960 | 960 | 960 | 3840 |
| 16 | | 950 | 950 | 950 | 950 | 3800 |
| 15 | | 940 | 940 | 940 | 940 | 3760 |
| 14 | | 930 | 930 | 930 | 930 | 3720 |
| 13 | | 920 | 920 | 920 | 920 | 3680 |
| 12 | | 910 | 910 | 910 | 910 | 3640 |
| 11 | | 900 | 900 | 900 | 900 | 3600 |
| 10 | | 890 | 890 | 890 | 890 | 3560 |
| 9 | | 880 | 880 | 880 | 880 | 3520 |
| 8 | | 870 | 870 | 870 | 870 | 3480 |
| 7 | | 860 | 860 | 860 | 860 | 3440 |
| 6 | | 850 | 850 | 850 | 850 | 3400 |
| | | | Graph B | | | |
| 21 | First | 1000 | 1000 | 1000 | 1000 | 4000 |
| 20 | operation | 990 | 990 | 990 | 990 | 3960 |
| 19 | mode | 980 | 980 | 980 | 980 | 3920 |
| 18 | | 700 | 1000 | 1000 | 700 | 3400 |
| 17 | Second | 690 | 990 | 990 | 690 | 3360 |
| 16 | operation | 680 | 980 | 980 | 680 | 3280 |
| 15 | mode | 670 | 970 | 970 | 670 | 3240 |
| 14 | | 660 | 960 | 960 | 660 | 3200 |
| 13 | | 650 | 960 | 960 | 650 | 3200 |
| 12 | | 640 | 940 | 940 | 640 | 3160 |
| 11 | Third | 700 | 700 | 700 | 700 | 2800 |
| 10 | operation | 690 | 690 | 690 | 690 | 2760 |
| 9 | mode | 680 | 680 | 680 | 680 | 2720 |
| 8 | | 670 | 670 | 670 | 670 | 2680 |
| 7 | | 660 | 660 | 660 | 660 | 2640 |
| 6 | | 650 | 650 | 650 | 650 | 2600 | associated with a beam book of an amplifier module included in the amplifier array 340, corresponding to an operation mode of the amplifier array 340. The beam book may include angles of beams radiated by an antenna (e.g., the antenna array 330) for performing beamforming.

According to an embodiment, the communication processor 310 may obtain a lookup table associated with a beam book corresponding to an operation mode. The communication processor (e.g., the communication processor 310 in Referring to the graph and Table 2, the amplifier array 340 may have a power consumption reduction effect of about 12% when operating in the second operation mode and a power consumption reduction effect of about 22% when operating in the third operation mode.

FIG. 8 illustrates an embodiment of operation for a wireless communication connection between a base station and an electronic device in a second network (e.g., the second cellular network 294 of FIG. 2 (e.g., a 5G network))

using a directional beam for the wireless connection according to an embodiment of the disclosure.

Referring to FIG. 8, first, a base station (e.g., a gNodeB (gNB), a transmission reception point (TRP)) 820 may perform a beam detection operation with the electronic device 101 for the wireless communication connection. In the illustrated embodiment, for beam detection, the base station 820 may perform transmission beam sweeping 830 at least once by sequentially transmitting a plurality of transmission beams, for example, first to fifth transmission beams 835-1, 835-2, 835-3, 835-4, and 835-5 having different directions.

The first to fifth transmission beams 835-1, 835-2, 835-3, 835-4, and 835-5 may include at least one synchronization sequence (SS)/physical broadcast channel (PBCH) block (SS/PBCH Block). The SS/PBCH Block may be used to periodically measure the channel or beam strength of the electronic device 101.

In another embodiment, the first through fifth transmission beams 835-1, 835-2, 835-3, 835-4, and 835-5 may include at least one channel state information-reference signal (CSI-RS). The CSI-RS is a reference/reference signal that may be flexibly configured by the base station 820 and may be transmitted periodically/semi-persistently, or aperiodically. The electronic device 101 may measure the channel or beam strength by using the CSI-RS.

The transmission beams may form a radiation pattern having a selected beam width. For example, the transmission beams may have a broad radiation pattern with a first beam width, or a sharp radiation pattern with a second beam width narrower than the first beam width. For example, the transmission beams including the SS/PBCH Block may have a broader radiation pattern than the transmission beams including the CSI-RS.

The electronic device 101 may perform reception beam sweeping 840 while the base station 820 performs the transmission beam sweeping 830. For example, the electronic device 101 may fix a first reception beam 845-1 in a first direction while the base station 820 is first performing the transmission beam sweeping 830 so as to receive a signal of the SS/PBCH Block transmitted through at least one of the first to fifth transmission beams 835-1, 835-2, 835-3, 835-4, and 835-5. The electronic device 101 may fix a second reception beam 845-2 in a second direction while the base station 820 secondly performing the transmission beam sweeping 830 so as to receive a signal of the SS/PBCH Block transmitted through the first to fifth transmission beams 835-1, 835-2, 835-3, 835-4, and 835-5. The electronic device 101 may fix a third reception beam 845-3 in a third direction while the base station 820 thirdly performing the transmission beam sweeping 830 so as to receive a signal of the SS/PBCH Block transmitted through the first to fifth transmission beams 835-1, 835-2, 835-3, 835-4, and 835-5. As such, the electronic device 101 may select a communicable reception beam (e.g., the second reception beam 845-2) and transmission beam (e.g., the third transmission beam 835-3) based on a result of the signal receiving operation through the reception beam sweeping 840.

As described above, after communicable transmission/reception beams are determined, the base station 420 and the electronic device 101 may transmit and/or receive basic information for cell configuration, and may configure additional beam operation information based thereon. For example, the beam operation information may include detailed information on a configured beam, an SS/PBCH block, CSI-RS, or configuration information on an additional reference signal.

In addition, the electronic device 101 may continuously monitor channel and beam strengths by using at least one of an SS/PBCH block and a CSI-RS included in the transmission beam. The electronic device 101 may adaptively select a beam having a good beam quality by using the monitoring operation. Optionally, when the communication connection is released due to movement of the electronic device 101 or blocking of the beam, the beam sweeping operation may be performed again to determine a communicable beam.

Figure 9:
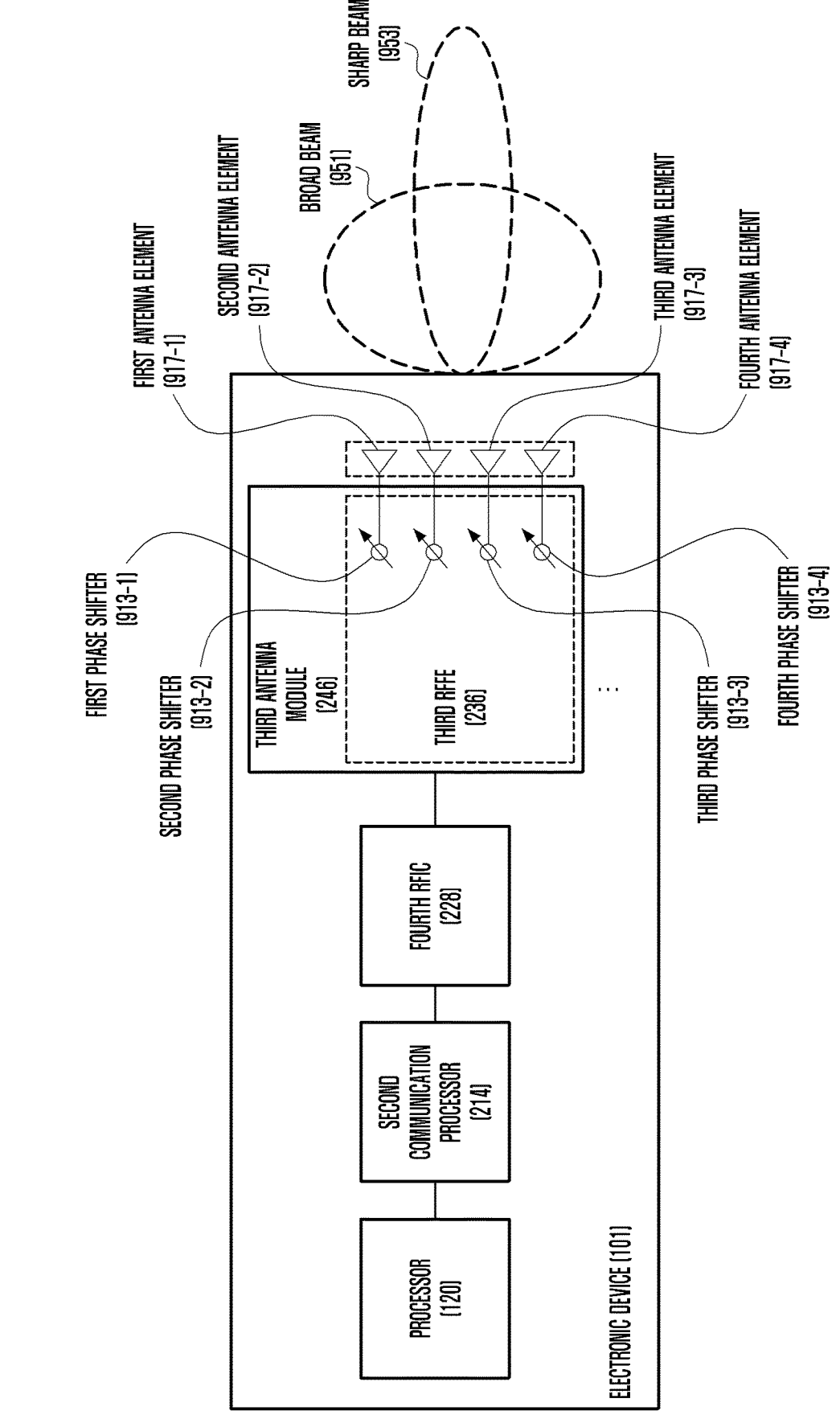
FIG. 9 is a block diagram of an electronic device for 5G network communication according to an embodiment of the disclosure.

FIG. 9 is a block diagram of an electronic device for 5G network communication according to an embodiment of the disclosure.

The electronic device 101 may include various components shown in FIG. 2, but in FIG. 9, for brief explanation, is shown to include a processor 120, a second communication processor 214, a fourth RFIC 228, and at least one third antenna module 246.

Referring to FIG. 9, in the illustrated embodiment, a third antenna module 246 may include first to fourth phase shifters 913-1, 913-2, 913-3, and 913-4 (e.g., the plurality of phase shifters 238 of FIG. 2) and/or first to fourth antenna elements 917-1, 917-2, 917-3, and 917-4 (e.g., the antenna 248 of FIG. 2). The first to fourth antenna elements 917-1 to 917-4 may be electrically connected to the first to fourth phase shifters 913-1 to 913-4, respectively. The first to fourth antenna elements 917-1 to 917-4 may form at least one antenna array 915.

The second communication processor 214 may control the phase of the signals transmitted and/or received through the first to fourth antenna elements 917-1 to 917-4 by controlling the first to fourth phase shifters 913-1 to 913-4, and accordingly may generate a transmission beam and/or a reception beam in a selected direction.

According to an embodiment, the third antenna module 246 may form a beam 951 with the above-mentioned broad radiation pattern (hereinafter, referred to as a "broad beam") or a beam 952 with the sharp radiation pattern (hereinafter, referred to as a "sharp beam"), depending on the number of antenna elements used.

For example, the third antenna module 246 may form the sharp beam 952 when all of the first to fourth antenna elements 917-1 to 917-4 are used, and may form the broad beam 951 when only the first antenna element 917-1 and the second antenna element 917-2 are used. The broad beam 951 has a broader coverage than the sharp beam 952, but has a small antenna gain, which may be more effective for beam search. On the other hand, the sharp beam 952 may have a narrower coverage than the broad beam 951 but has a higher antenna gain, so that communication performance can be improved.

According to various embodiments, the amplifier array connected to the first to fourth antenna elements 917-1 to 917-4 may form the sharp beam 952 even when the amplifier array is in a first operation mode, a second operation mode, and a third operation mode.

An electronic device 300 according to various embodiments of the disclosure may include an amplifier array 340 including at least one amplifier module, an antenna array 330 including at least one mmWave antenna connected to the at least one amplifier module, and a communication processor 310, wherein the communication processor 310 is configured to identify a state of the electronic device, identify an operation mode of the amplifier array 340 corresponding to the state of the electronic device, control the amplifier array 340 to operate in the operation mode, and control the antenna array 330 to radiate a beam based on a signal amplified by the amplifier array 340 operating in the operation mode.

In the electronic device 300 according to various embodiments of the disclosure, the amplifier array 340 may include a first amplifier group including at least one amplifier module disposed on the outer side of the amplifier array 340 and a second amplifier group including at least one amplifier module disposed on the inner side of the amplifier array 340, and the communication processor 310 is configured to control the amplifier group such that the first amplifier group and the second amplifier group each operates in one of a high-power mode or a low-power mode according to the operation mode of the amplifier array 340.

In the electronic device 300 according to various embodiments of the disclosure, the communication processor 310 is configured to, in response to the operation mode being in a first operation mode, control the amplifier array 340 such that the first amplifier group operates in the high-power mode and the second amplifier group operates in the high-power mode.

In the electronic device 300 according to various embodiments of the disclosure, the communication processor 310 is configured to, in response to the operation mode being in a second operation mode, control the amplifier array 340 such that the first amplifier group operates in the low-power mode and the second amplifier group operates in the high-power mode.

In the electronic device 300 according to various embodiments of the disclosure, the communication processor 310 is configured to, in response to the operation mode being in a third operation mode, control the amplifier array 340 such that the first amplifier group operates in the low-power mode and the second amplifier group operates in the low-power mode.

In the electronic device 300 according to various embodiments of the disclosure, the communication processor 310 is configured to, in response to a state of the electronic device 300 being in a power saving mode, control the amplifier array 340 to operate in a second operation mode.

In the electronic device 300 according to various embodiments of the disclosure, the amplifier array 340 may be controlled to operate in a third operation mode in response to a state in which a residual amount of a battery of the electronic device 300 is less than or equal to a designated value.

In the electronic device 300 according to various embodiments of the disclosure, the amplifier array 340 may be controlled such that the amplifier array 340 operates in a first mode in response to a network state of the electronic device 300 being in a weak electric field, the amplifier array 340 operates in a second mode in response to a network state of the electronic device 300 being in a medium electric field, and the amplifier array 340 operates in a third mode in response to a network state of the electronic device 300 being in a strong electric field.

The electronic device 300 according to various embodiments of the disclosure may further include a memory configured to store information associated with an input power and an operation mode of the amplifier array 340 according to a target power, the communication processor 310 is configured to identify a network state of the electronic device, and control the amplifier array 340 based on an operation mode of the amplifier array 340 according to the target power corresponding to the network state, and the information associated with the input power.

In the electronic device 300 according to various embodiments of the disclosure, the at least one amplifier module may include a first transistor cell and a second transistor cell having a larger size than the first transistor cell.

In the electronic device 300 according to various embodiments of the disclosure, the communication processor 310 may be configured to control the at least one amplifier module to amplify a signal in the first transistor cell in the low-power mode, and amplify a signal in the second transistor cell in the high-power mode.

In the electronic device 300 according to various embodiments of the disclosure, the first transistor cell operates at a first bias, the second transistor cell operates at a second bias, and the communication processor 310 may be configured to perform control to apply the first bias to a communication circuit in the low-power mode, and apply the second bias to the communication circuit in the high-power mode.

An operation method of an electronic device 300 including an mmWave antenna according to various embodiments of the disclosure may include identifying a state of the electronic device, identifying an operation mode of an amplifier array 340 including at least one amplifier module corresponding to a state of the electronic device, controlling the amplifier array 340 to operate in the operation mode, and controlling the antenna array 330 to radiate a beam based on a signal amplified by the amplifier array 340 operating in the operation mode.

In the operation method of an electronic device 300 according to various embodiments of the disclosure, the amplifier array 340 may include a first amplifier group including at least one amplifier module disposed on the outer side of the amplifier array 340 and a second amplifier group including at least one amplifier module disposed on the inner side of the amplifier array 340, and the operation method may include controlling the amplifier group such that the first amplifier group and the second amplifier group each operates in one of a high-power mode or a low-power mode according to the operation mode of the amplifier array 340.

The operation method of an electronic device 300 according to various embodiments of the disclosure may include, in response to the operation mode being in a first operation mode, controlling the amplifier array 340 such that the first amplifier group operates in the high-power mode and the second amplifier group operates in the high-power mode.

The operation method of an electronic device 300 according to various embodiments of the disclosure may include, in response to the operation mode being in a second operation mode, controlling the amplifier array 340 such that the first amplifier group operates in the low-power mode and the second amplifier group operates in the high-power mode.

The operation method of an electronic device 300 according to various embodiments of the disclosure may include, in response to the operation mode being in a third operation mode, controlling the amplifier array 340 such that the first amplifier group operates in the low-power mode and the second amplifier group operates in the low-power mode.

The operation method of an electronic device 300 according to various embodiments of the disclosure may include, in response to a state of the electronic device 300 being in a power saving mode, controlling the amplifier array 340 to operate in a second operation mode.

The operation method of an electronic device 300 according to various embodiments of the disclosure may include, in response to a state in which a residual amount of a battery of the electronic device 300 is less than or equal to a designated value, controlling the amplifier array 340 to operate in a third operation mode.

The operation method of an electronic device 300 according to various embodiments of the disclosure may include controlling the amplifier array 340 such that the amplifier array 340 operates in a first mode in response to a network state of the electronic device 300 being in a weak electric field, the amplifier array 340 operates in a second mode in response to the network state of the electronic device 300 being in a medium electric field, and the amplifier array 340 operates in a third mode in response to the network state of the electronic device 300 being in a strong electric field.

The operation method of an electronic device 300 according to various embodiments of the disclosure may include identifying a network state of the electronic device, and controlling the amplifier array 340 based on an operation mode of the amplifier array 340 according to the target power corresponding to the network state, and the information associated with the input power.

In the operation method of an electronic device 300 according to various embodiments of the disclosure, the at least one amplifier module includes a first transistor cell and a second transistor cell having a larger size than the first transistor cell, and the operation method may include controlling the at least one amplifier module to amplify a signal in the first transistor cell in the low-power mode, and amplify a signal in the second transistor cell in the high-power mode.

In the operation method of an electronic device 300 according to various embodiments of the disclosure, the first transistor cell operates at a first bias, the second transistor cell operates at a second bias, and the operation method may include performing control to apply the first bias to a communication circuit in the low-power mode, and apply the second bias to the communication circuit in the high-power mode.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it denotes that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic,"

"logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply denotes that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:

an amplifier array including a first amplifier group disposed on an outer side of the amplifier array, and a second amplifier group disposed on an inner side of the amplifier array;

an antenna array including at least one millimeter-wave (mmWave) antenna connected to the amplifier array; and a communication processor configured to:
    identify a state of the electronic device,
    determine an operation mode of the amplifier array corresponding to the identified state of the electronic device,
    when the determined operation mode is a first operation mode, control the first amplifier group to operate in a high-power mode and control the second amplifier group to operate in the high-power mode,
    when the determined operation mode is a second operation mode, control the first amplifier group to operate in a low-power mode and control the second amplifier group to operate in the high-power mode,
    when the determined operation mode is a third operation mode, control the first amplifier group to operate in the low-power mode and control the second amplifier group to operate in the low-power mode, and
    control the antenna array to radiate a beam based on a signal amplified by the amplifier array operating in the operation mode.

2. The electronic device of claim 1, wherein the communication processor is further configured to:
    in response to the state of the electronic device being in a power saving mode state, control the amplifier array to operate in the second operation mode.

3. The electronic device of claim 1, wherein the communication processor is further configured to:
    in response to the electronic device being in a state in which a residual amount of a battery of the electronic device is less than or equal to a designated value, control the amplifier array to operate in the third operation mode.

4. The electronic device of claim 1, wherein the communication processor is further configured to:
    in response to a network state of the electronic device being in a weak electric field, control the amplifier array to operate in the first operation mode,
    in response to the network state of the electronic device being in a medium electric field, control the amplifier array to operate in the second operation mode, and
    in response to the network state of the electronic device being in a strong electric field, control the amplifier array to operate in a third mode.

5. The electronic device of claim 4, further comprising:
    a memory storing the operation mode of the amplifier array according to a target power and information associated with input power,
    wherein the communication processor is further configured to:
        identify the network state of the electronic device, and
        control the amplifier array based on the operation mode of the amplifier array according to the target power corresponding to the network state, and the information associated with the input power.

6. The electronic device of claim 1, wherein the amplifier array comprises a first transistor cell and a second transistor cell having a larger size than the first transistor cell.

7. The electronic device of claim 6, wherein the communication processor is further configured to:
    control the amplifier array to amplify a signal in the first transistor cell in the low-power mode, and
    control the amplifier array to amplify a signal in the second transistor cell in the high-power mode.

8. The electronic device of claim 7,
    wherein the first transistor cell operates at a first bias,
    wherein the second transistor cell operates at a second bias, and
    wherein the communication processor is further configured to:
    apply the first bias to a communication circuit in the low-power mode, and
    apply the second bias to the communication circuit in the high-power mode.

9. An operation method of an electronic device including a millimeter-wave (mmWave) antenna, the operation method comprising:
    identifying a state of the electronic device;
    determining an operation mode of an amplifier array corresponding to the identified state of the electronic device, wherein the amplifier array comprises a first amplifier group disposed on an outer side of the amplifier array, and a second amplifier group disposed on an inner side of the amplifier array;
    when the determined operation mode is a first operation mode, controlling the first amplifier group to operate in a high-power mode and control the second amplifier group to operate in the high-power mode;
    when the determined operation mode is a second operation mode, controlling the first amplifier group to operate in a low-power mode and control the second amplifier group to operate in the high-power mode;
    when the determined operation mode is a third operation mode, controlling the first amplifier group to operate in the low-power mode and control the second amplifier group to operate in the low-power mode; and
    controlling an antenna array to radiate a beam based on a signal amplified by the amplifier array operating in the operation mode.

10. The operation method of claim 9, further comprising:
    in response to the state of the electronic device being in a power saving mode state, controlling the amplifier array to operate in the second operation mode.

11. The operation method of claim 9, further comprising:
    in response to the electronic device being in a state in which a residual amount of a battery of the electronic device is less than or equal to a designated value, controlling the amplifier array to operate in the third operation mode.

12. The operation method of claim 9, further comprising:
    in response to a network state of the electronic device being in a weak electric field, controlling the amplifier array to operate in the first operation mode;
    in response to the network state of the electronic device being in a medium electric field, controlling the amplifier array to operate in the second operation mode; and
    in response to the network state of the electronic device being in a strong electric field, controlling the amplifier array to operate in the third operation mode.

* * * * *